(12) United States Patent
Weisman et al.

(10) Patent No.: US 11,955,728 B2
(45) Date of Patent: Apr. 9, 2024

(54) DIFFERENTIAL ON-CHIP LOOP ANTENNA

(71) Applicant: Intel Corporation, Santa Clara, CA (US)

(72) Inventors: Nir Weisman, Hod Hasharon M (IL); Omer Asaf, Oranit M (IL); Eyal Goldberger, Moshav Beherotaim M (IL)

(73) Assignee: Intel Corporation, Santa Clara, CA (US)

( * ) Notice: Subject to any disclaimer, the term of this patent is extended or adjusted under 35 U.S.C. 154(b) by 318 days.

(21) Appl. No.: 17/381,073

(22) Filed: Jul. 20, 2021

(65) Prior Publication Data
US 2021/0351511 A1 Nov. 11, 2021

Related U.S. Application Data
(63) Continuation of application No. 15/716,930, filed on Sep. 27, 2017, now Pat. No. 11,108,156.

(51) Int. Cl.
*H01Q 7/00* (2006.01)
*H01L 23/552* (2006.01)
(Continued)

(52) U.S. Cl.
CPC ............ *H01Q 7/00* (2013.01); *H01L 23/552* (2013.01); *H01L 23/66* (2013.01); *H01Q 1/2283* (2013.01);
(Continued)

(58) Field of Classification Search
CPC ........ H01Q 7/00; H01Q 1/2283; H01Q 5/371; H01Q 21/06; H01Q 25/001; H01Q 1/50;
(Continued)

(56) References Cited

U.S. PATENT DOCUMENTS

| 2,426,193 A | 8/1947 | Fernsler |
| 5,136,244 A | 8/1992 | Jones et al. |
| (Continued) | | |

FOREIGN PATENT DOCUMENTS

| CN | 103915421 A | 7/2014 |
| JP | H11103212 A | 4/1999 |
| (Continued) | | |

OTHER PUBLICATIONS

English translation of JP-2013243385-A, pp. 1-18, Dec. 5, 2013 (Year: 2013).*

(Continued)

*Primary Examiner* — Daniel D Chang
(74) *Attorney, Agent, or Firm* — Akona IP PC

(57) ABSTRACT

Aspects of the embodiments are directed to an on-chip loop antenna and methods of manufacturing the same. In some embodiments, the on-chip loop antenna is in an integrated circuit (IC) die. The IC die comprises metal loops substantially centered around a core region of the IC die in a metallization stack of the IC die, a dielectric between spaces of the metal loops, an electric circuit in the core region electrically connected to the metal loops with an interconnect, and a ground plane in the metallization stack electrically connected to the loops with a first plurality of vias and to the electric circuit with a second plurality of vias. The first plurality of vias is different from the second plurality of vias, and the electric circuit includes an inductor. In some embodiments, the on-chip loop antenna can be carried by a semiconductor package.

20 Claims, 10 Drawing Sheets

(51) Int. Cl.
*H01L 23/66* (2006.01)
*H01Q 1/22* (2006.01)
*H01Q 5/371* (2015.01)
*H01Q 21/06* (2006.01)
*H01Q 25/00* (2006.01)

(52) U.S. Cl.
CPC ............. *H01Q 5/371* (2015.01); *H01Q 21/06* (2013.01); *H01Q 25/001* (2013.01); *H01L 2223/6677* (2013.01)

(58) Field of Classification Search
CPC ......... H01Q 7/04; H01L 23/552; H01L 23/66; H01L 2223/6677
See application file for complete search history.

(56) References Cited

U.S. PATENT DOCUMENTS

| | | | |
|---|---|---|---|
| 5,673,053 | A | 9/1997 | Marthinsson |
| 6,016,255 | A | 1/2000 | Bolan et al. |
| 6,373,447 | B1 | 4/2002 | Rostoker et al. |
| 7,466,284 | B2 | 12/2008 | Barry |
| 8,633,777 | B2 | 1/2014 | Jin et al. |
| 9,489,606 | B1 | 11/2016 | Korhummel et al. |
| 9,831,564 | B1 | 11/2017 | Xie |
| 10,497,646 | B2 | 12/2019 | Liang et al. |
| 2004/0135726 | A1 | 7/2004 | Shamir et al. |
| 2005/0191977 | A1 | 9/2005 | Bhatti |
| 2006/0055541 | A1 | 3/2006 | Bleckmann |
| 2006/0109182 | A1 | 5/2006 | Rosenberg et al. |
| 2006/0214798 | A1* | 9/2006 | Wang .................... G06Q 10/00 340/572.1 |
| 2007/0200748 | A1 | 8/2007 | Hoegerl et al. |
| 2008/0157974 | A1 | 7/2008 | Boss et al. |
| 2008/0179404 | A1 | 7/2008 | Finn |
| 2009/0188703 | A1* | 7/2009 | Ito .......................... H01L 24/18 174/255 |
| 2009/0213027 | A1 | 8/2009 | Finn |
| 2009/0218407 | A1 | 9/2009 | Rofougaran |
| 2009/0295567 | A1 | 12/2009 | Bellows |
| 2009/0315320 | A1 | 12/2009 | Finn |
| 2010/0321035 | A1 | 12/2010 | Masuda |
| 2011/0068985 | A1* | 3/2011 | Hillersborg ............ H01Q 1/244 343/702 |
| 2011/0260943 | A1 | 10/2011 | Felic et al. |
| 2012/0038445 | A1 | 2/2012 | Finn |
| 2012/0074233 | A1 | 3/2012 | Finn et al. |
| 2013/0050050 | A1 | 2/2013 | Zhu et al. |
| 2013/0225102 | A1 | 8/2013 | Tsutsumi et al. |
| 2013/0314291 | A1 | 11/2013 | Franzon et al. |
| 2014/0028518 | A1 | 1/2014 | Arnold et al. |
| 2014/0247192 | A1 | 9/2014 | Ikemoto et al. |
| 2014/0325150 | A1 | 10/2014 | Hashimoto et al. |
| 2015/0269474 | A1 | 9/2015 | Finn et al. |
| 2015/0278675 | A1 | 10/2015 | Finn et al. |
| 2016/0043455 | A1 | 2/2016 | Seler et al. |
| 2016/0180212 | A1 | 6/2016 | Herslow et al. |
| 2016/0233581 | A1 | 8/2016 | Kim et al. |
| 2016/0261036 | A1 | 9/2016 | Sato et al. |
| 2016/0365644 | A1 | 12/2016 | Finn et al. |
| 2017/0077589 | A1 | 3/2017 | Finn et al. |
| 2017/0125881 | A1 | 5/2017 | Mangrum et al. |
| 2017/0125892 | A1 | 5/2017 | Arbabian et al. |
| 2017/0250720 | A1 | 8/2017 | Michaeli et al. |
| 2017/0301636 | A1 | 10/2017 | Tong et al. |
| 2018/0048048 | A1 | 2/2018 | Socher et al. |
| 2019/0081402 | A1 | 3/2019 | Kato |
| 2019/0140352 | A1 | 5/2019 | Zolomy et al. |
| 2019/0280383 | A1 | 9/2019 | Zolomy et al. |

FOREIGN PATENT DOCUMENTS

| | | | | |
|---|---|---|---|---|
| JP | 2002083894 | A | 3/2002 | |
| JP | 2003256798 | A | 9/2003 | |
| JP | 2009295643 | A | 12/2009 | |
| JP | 2013005211 | A | 1/2013 | |
| JP | 2013243385 | A * | 12/2013 | ............ H01Q 1/2208 |
| WO | WO-2009093343 | A1 * | 7/2009 | ........ H01L 23/49838 |
| WO | 2010001987 | A1 | 1/2010 | |
| WO | 2016135730 | A1 | 9/2016 | |

OTHER PUBLICATIONS

English translation of WO-2009093343-A1, pp. 1-25, Jul. 30, 2009 (Year: 2009).*
Final Office Action in U.S. Appl. No. 15/716,930 dated Feb. 19, 2021, 14 pages.
Non Final Office Action in U.S. Appl. No. 15/716,930 dated Aug. 21, 2020, 23 pages.
Notice of Allowance in U.S. Appl. No. 15/716,930 dated May 17, 2021, 6 pages.

* cited by examiner

DIFFERENTIAL ON-CHIP LOOP ANTENNA

CROSS-REFERENCE TO RELATED APPLICATION

This application is a continuation of U.S. patent application Ser. No. 15/716,930 filed on Sep. 27, 2017 and entitled "DIFFERENTIAL ON-CHIP LOOP ANTENNA", which is hereby incorporated by reference herein in their entirety.

BACKGROUND

The millimeter wave region of the electromagnetic spectrum is usually considered to be the range of wavelengths from 1 millimeter to 10 millimeter. Millimeter wave applications include transmitting large amounts of data, such as in high bandwidth telecommunications or radar technologies.

Multiple-input, multiple-output (MIMO) is an antenna technology for wireless communications in which multiple antennas are used at the source (transmitter) and/or the destination (receiver). The multiple antennas at each end of the communications circuit facilitate the use of multipath propagation techniques to minimize errors and optimize data speed.

Figure 1:
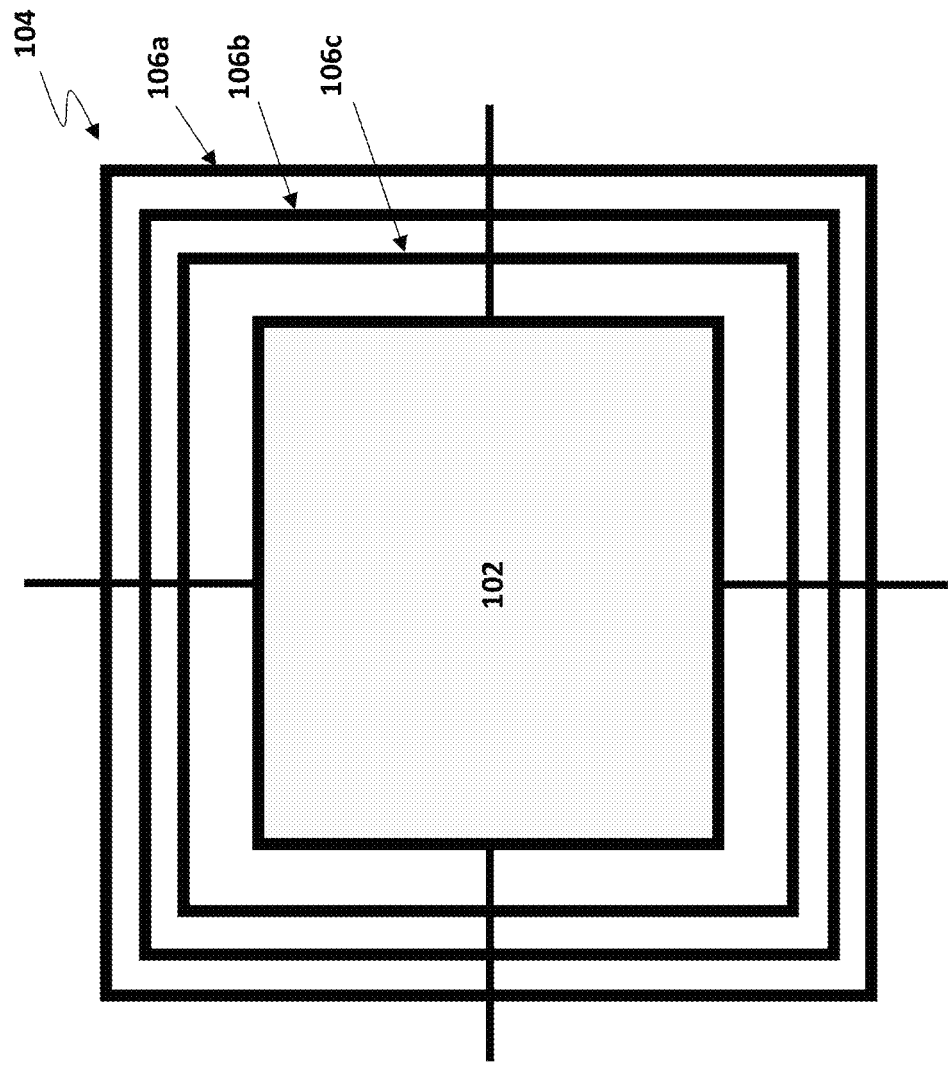
FIG. 1 is a schematic diagram of an example on-chip loop antenna in accordance with some embodiments of the present disclosure.

Figures may not be drawn to scale.

DETAILED DESCRIPTION

Described herein is an on-chip loop antenna surrounding a core circuit. In the following description, various aspects of the illustrative implementations will be described using terms commonly employed by those skilled in the art to convey the substance of their work to others skilled in the art. However, it will be apparent to those skilled in the art that the present disclosure may be practiced with some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. By contrast, a first layer "on" a second layer is in direct contact with that second layer. Similarly, unless explicitly stated otherwise, one feature disposed between two features may be in direct contact with the adjacent features or may have one or more intervening layers.

This disclosure describes an on-chip loop antenna, which is an antenna integrated into complementary metal oxide semiconductor (CMOS) technology. The on-chip loop antenna can replace a board antenna that requires a radio frequency (RF) transition from the chip interface to the board. The on-chip loop antenna can allow for the elimination of a dedicated board and may also shrink the overall package area, which may reduce cost.

Various ones of the on-chip loop antennas disclosed herein may exhibit one or more advantages over conventional on-chip antennas. For example, some conventional on-chip antennas are placed inside the die such that no circuits can be placed below or above the antenna. The on-chip loop antenna of the present disclosure not only aides in the elimination of the board antenna but also does not take any silicon area from the digital/analog/RF circuits, since the core circuitry, including the antenna driver, is placed inside the antenna. 2) The on-chip loop antenna of the present disclosure can be designed to the conjugate impedance of the driving element inside the silicon. This may eliminate or reduce the output matching stage which is commonly required in a conventional transition to the board.

FIG. 1 is a schematic diagram of an example on-chip loop antenna in accordance with embodiments of the present disclosure. The on-chip loop antenna 104 is integrated into the metallization stack used to interconnect the core circuitry 102 with other integrated circuit packaging areas. For example, the on-chip loop antenna 104 can be formed during metallization stack processing. The on-chip loop antenna 104 can be constructed using one or more metal layers of the metallization stack. The one or more metal layers can be made from a high conductivity metal, such as copper. The metal layer surrounds the core circuitry 102, which may be located at a different layer of the integrated circuit package.

In embodiments, the on-chip loop antenna 104 comprises a plurality of metal loops 106a-106c. The number of metal loops 106a-c and their respective width can be selected based on an estimation or determination of the overall impendence of the core circuitry antenna drivers. In embodiments, the number of metal loops 106a-c and their respective width can be selected based on the impedance of the interconnect coupling the on-chip loop antenna 104 with the core circuitry 102. The selection of the number of loops and respective widths can allow for the on-chip loop antenna 104 to be impedance matched with the core circuitry 102 and/or the antenna interconnect. In embodiments, the core circuitry 102 comprises antenna driver circuitry that is to differentially drive the on-chip loop antenna 104. In embodiments, the on-chip loop antenna is impedance matched (or substantially matched) to the impedance of the antenna driver circuitry.

Figure 2:
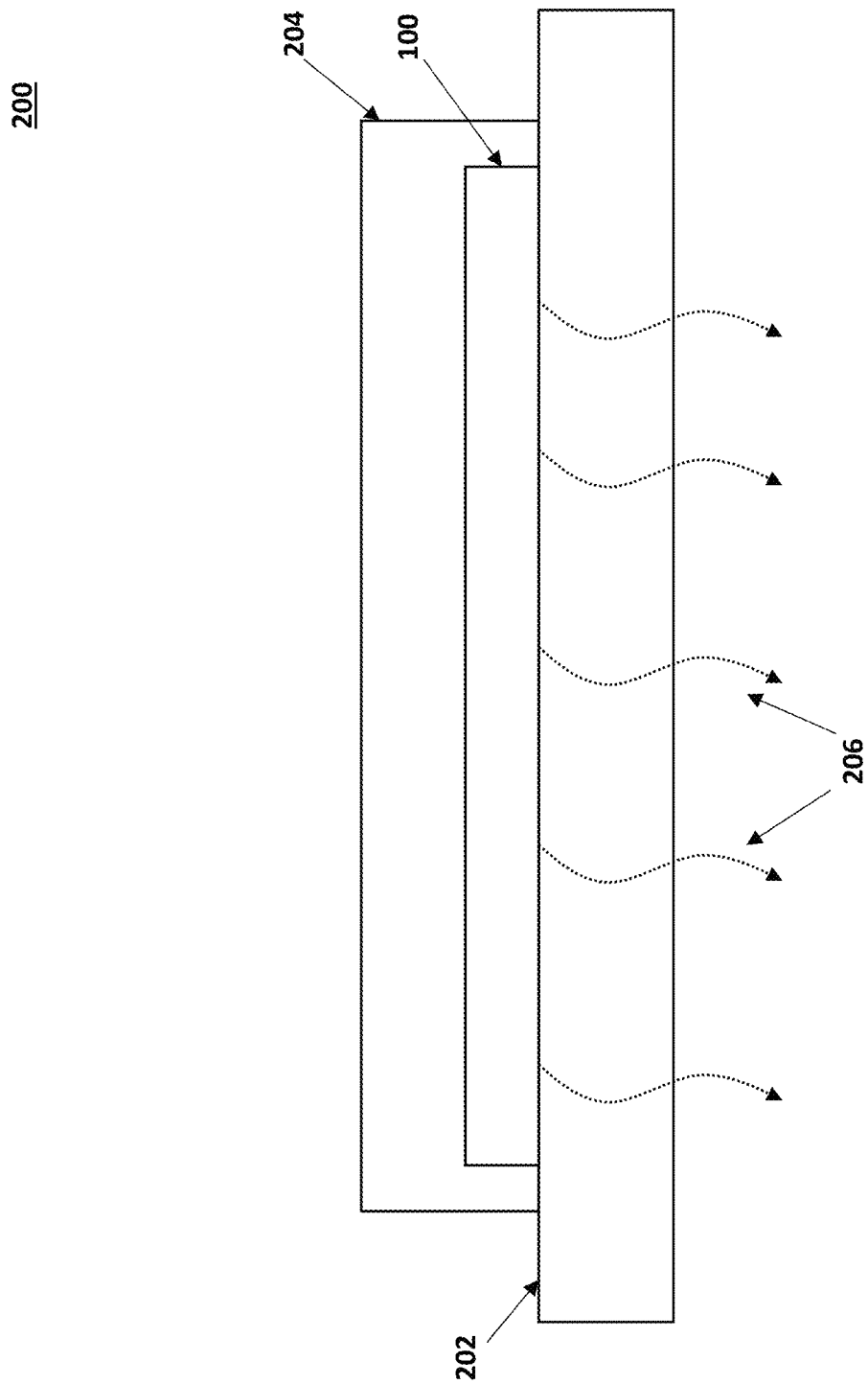
FIG. 2 is a schematic diagram of an example board that includes an on-chip loop antenna in accordance with some embodiments of the present disclosure.

FIG. 2 is a schematic diagram of an example board 200 that includes an on-chip loop antenna in accordance with embodiments of the present disclosure. The board 200 can include an integrated circuit chip 100 that includes integrated circuitry (e.g., core circuitry 102) and an on-chip loop antenna (such as on-chip loop antenna 104). The board 200 can include a printed circuit board (PCB) 202. The integrated circuit chip 100 can be a flip chip style integrated circuit. The integrated circuit chip 100 can interface physically and electronically with the PCB 202. The board 200 can include a shield 204. The shield 204 can be made of nickel silver (C7701) or other electromagnetic shielding material. The metal shield 204 can prevent signal leakage and helps to increase the antenna gain. The electromagnetic energy 206 is directed from the antenna through the PCB 202 into the air.

Figure 3A:
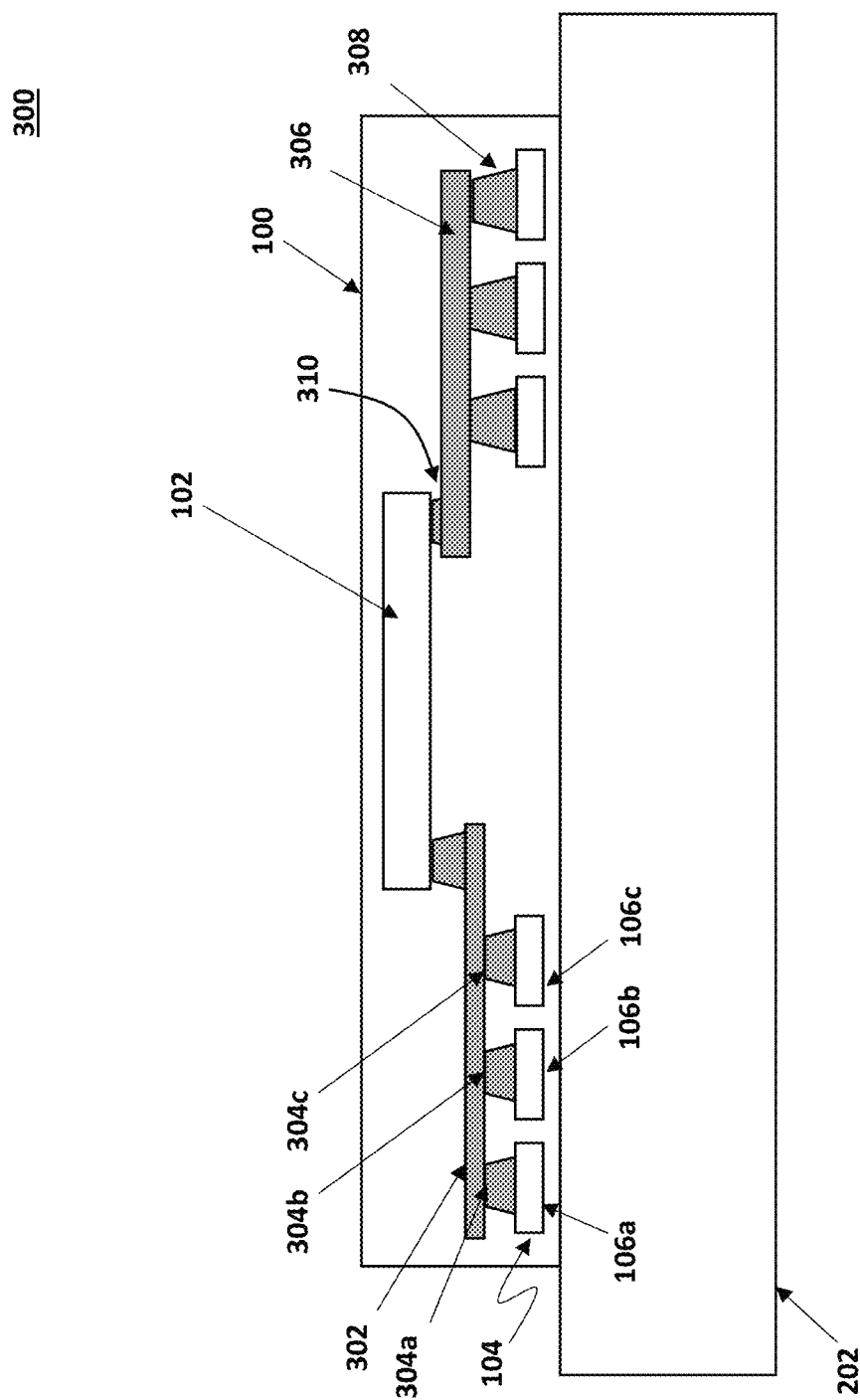
FIG. 3A is a schematic diagram of a cross-section of an example on-chip loop antenna in accordance with some embodiments of the present disclosure.

FIG. 3A is a schematic diagram of a cross-section of an example on-chip loop antenna 104 in accordance with embodiments of the present disclosure. The integrated circuit chip 100 includes one or more metal layers in which conductive materials (e.g., gold, platinum, palladium, titanium, copper, aluminum, silver, metals, other conductive materials, combinations of these, etc.) can be patterned to form the on-chip loop antenna 104. The on-chip loop antenna 104 can include multiple loops 106a-106c. The loops 106a-106c can be separated by a dielectric. Each loop 106a-106c can be stimulated by an antenna driver on the core circuitry 102 by an interconnect 304a-304c, respectively, by a trace 302. In embodiments, the loops 106a-106c can be interconnected in series. The integrated circuit chip 100 can include a ground plane 306 that is common for the on-chip loop antenna 104 and the core circuitry 102. The on-chip loop antenna 104 can be coupled to the ground plane 306 by via 308. The core circuitry 102 can be coupled to the ground plane 306 by a via 310.

The one or more loops 106a-106c can be formed by patterning of copper, gold or another conductive material in one or more metal layers of the integrated circuit chip 100. The metal can be formed by deposition, photolithography, electroplating, etc. Similarly, interconnects 304a-304c can be formed by depositing suitable patterns of conductive materials in one or more layers of the microchip 130. A combination of microfabrication techniques including, without limitation, the use of photoresists, masks, deposition techniques, and/or plating techniques can be employed to pattern materials and/or traces on the integrated circuit chip 100. The integrated circuit chip 100 can include a semiconductor die that includes the integrated circuit 102. The integrated circuit chip 100 can be coupled to the PCB 202 by electrical interconnects.

The on-chip loop antenna 104 can be formed having physical parameters that cause the on-chip loop antenna to have an impedance that matches the impedance of the interconnect (or the impedance generally of the core circuitry 102).

Figure 3B:
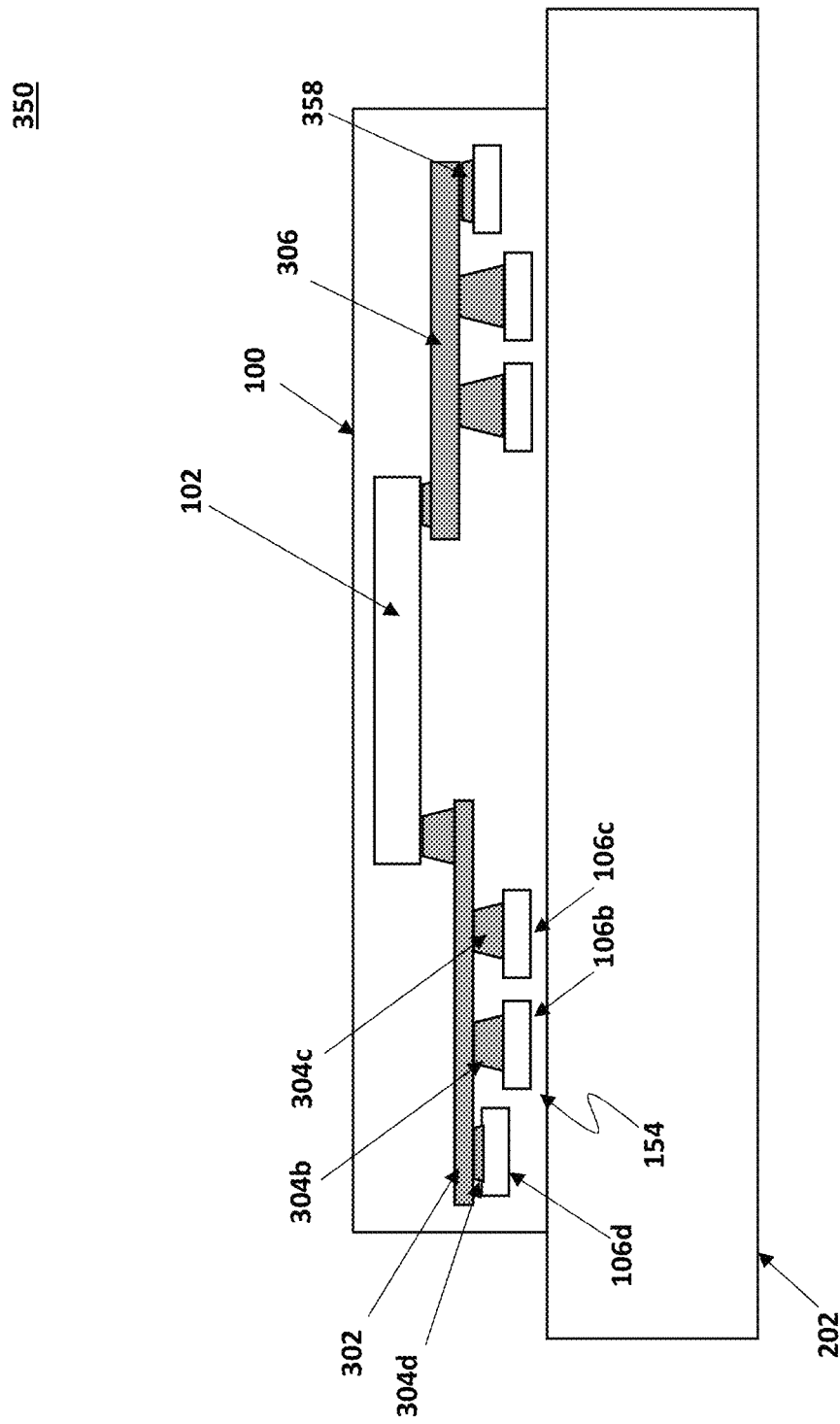
FIG. 3B is a schematic diagram of a cross-section of another example on-chip loop antenna in accordance with embodiments of the present disclosure.

FIG. 3B is a schematic diagram of a cross-section of another example on-chip loop antenna 154 in accordance with embodiments of the present disclosure. In FIG. 3B, the loops are formed using different metal layers. For example, loops 106b and 106c are formed at the M7 layer, while loop 106d are formed from a different metal layer (e.g., M6 or M5, etc.). The loop 106d can be connected to an interconnect trace 302 by a via 304d. The loop element 106d can be coupled to the ground plane 306 by a via 358.

Figure 4:
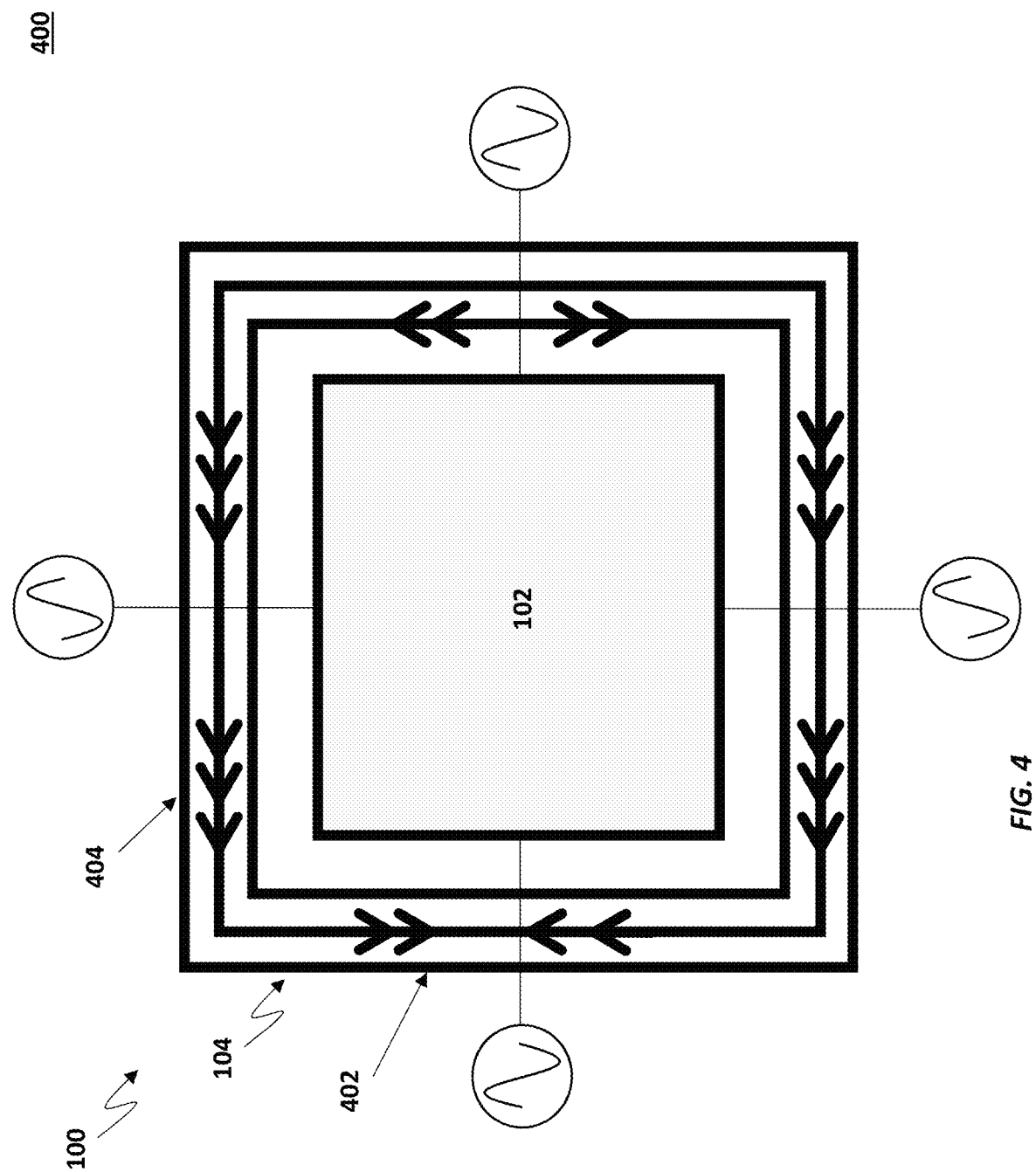
FIG. 4 is a schematic diagram of a differential operation of an example on-chip loop antenna in accordance with some embodiments of the present disclosure.

FIG. 4 is a schematic diagram 400 of a differential operation of an example on-chip loop antenna in accordance with embodiments of the present disclosure. The on-chip loop antenna can be excited differentially in two polarizations. The integrated circuit chip 100 is similar to that shown in FIG. 1, showing the core circuitry 102 surrounded by the on-chip loop antenna 104. The on-chip loop antenna 104 is excited differentially. In the normal axis 402, the incited currents will cancel each other out. In the horizontal axis 404, the currents can sum up and radiate.

Figure 5A:
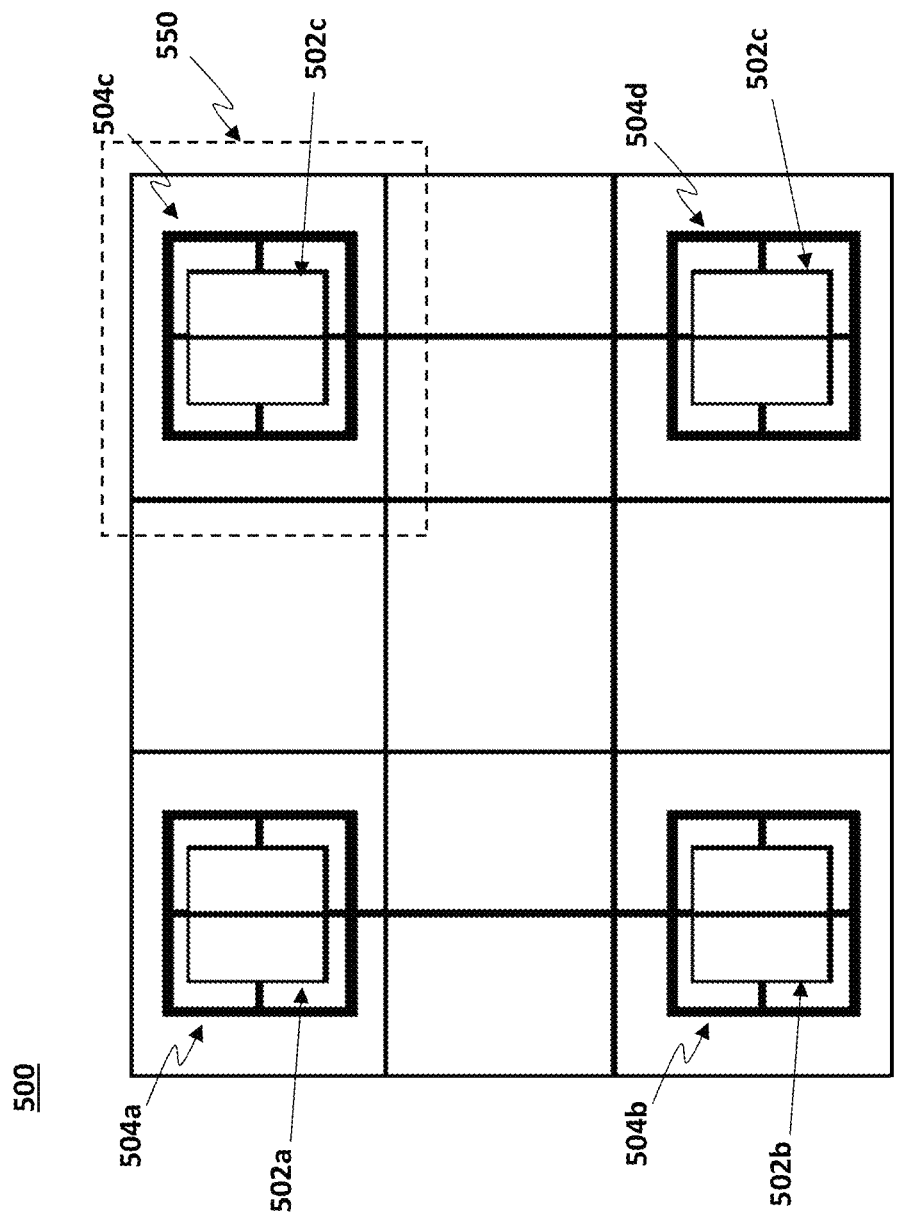
FIG. 5A is a schematic diagram of an array of on-chip loop antennas in accordance with some embodiments of the present disclosure.

FIG. 5A is a schematic diagram of an array 500 of on-chip loop antennas in accordance with embodiments of the present disclosure. The array 500 includes four on-chip loop antennas 504a-d, each surrounding an integrated circuit 502a-d respectively. The on-chip loop antennas not only remove the separate board of the antenna array and the associated costs but also maintain the same silicon area for the system on chip (SoC) integrated circuitry. The on-chip loop antenna array 500 is especially suitable for phased array applications. The antenna array 500 can be used for phased array applications, such as WiGig and 5G applications.

In embodiments, the on-chip loop antenna array can be used in multiple-input multiple-output (MIMO) applications. Two polarizations can be used in each loop antenna element 504a-c providing an antenna array with dual polarization.

Figure 5B:
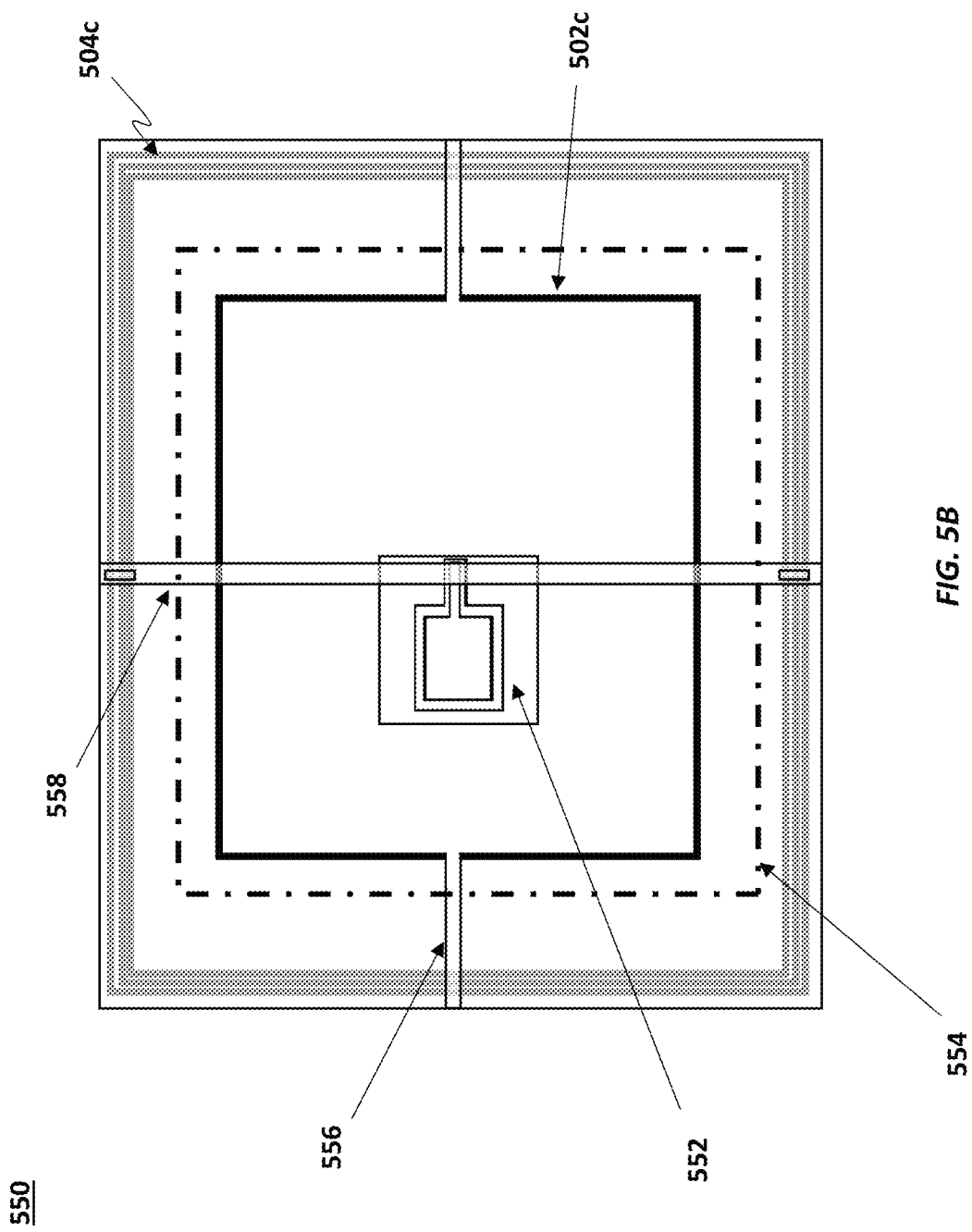
FIG. 5B is a schematic diagram of a close-up view an on-chip loop antenna from the antenna array.

FIG. 5B is a schematic diagram of a close-up view an on-chip loop antenna 504c from the antenna array 500. The core circuit ground 554 can have an impact on the antenna performance. The ground plane can reside in the space between the loop antenna elements 504a-d and can surround each integrated circuit 502a-d. Each loop antenna 504a-d can surround another portion of the ground plane. In embodiments, the ground plane can be seen as a parasitic patch antenna inside the loop antenna. An inductor 552 can be used to compensate for signal loss from electromagnetic interference or other losses. FIG. 5B further illustrates transmission lines 556 and 558 that can electrically couple the integrated circuit 502c to the loop antenna 504c.

Figure 6:
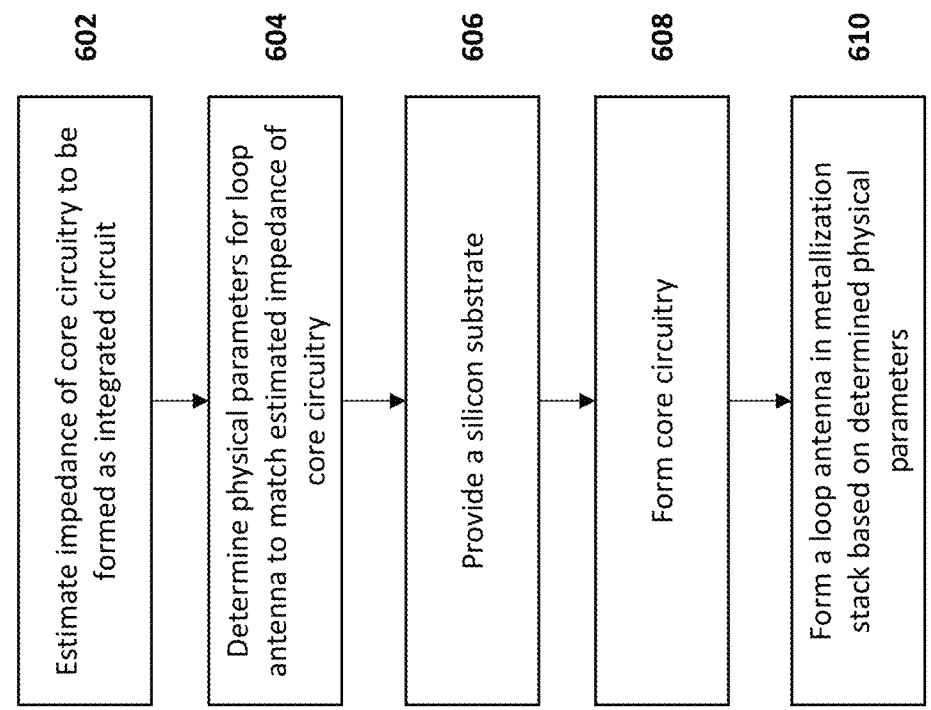
FIG. 6 is a process flow diagram for fabricating an on-chip loop antenna in accordance with some embodiments of the present disclosure.

FIG. 6 is a process flow diagram 600 for fabricating an on-chip loop antenna in accordance with embodiments of the present disclosure. In embodiments, an impedance of a core circuit, such as a core circuit implemented in an integrated circuit, can be estimated (602). The impedance of the core circuit can be estimated based on simulations of the integrated circuit design and components. One or more physical characteristics of an on-chip loop antenna can be determined based on the estimated impedance of the core circuit (604). Such physical characteristics can include a thickness of metal used for the antenna, the number of loops used, the metal layer of each loop, the width of each loop, a metal material used for the antenna, etc. A semiconductor substrate can be provided (606). An integrated circuit can be formed using the semiconductor substrate (608). The on-chip loop antenna can be formed during formation of a metallization stack of an integrated circuit package (610). In FIG. 6, the process illustrates the formation of the integrated circuit (608) and the formation of the on-chip loop antenna (610). The order is not meant to be specified by the process flow diagram. The metal for the on-chip loop antenna can be formed by patterned deposition, photolithography, electroplating, electroless plating, etc.

Figure 7:
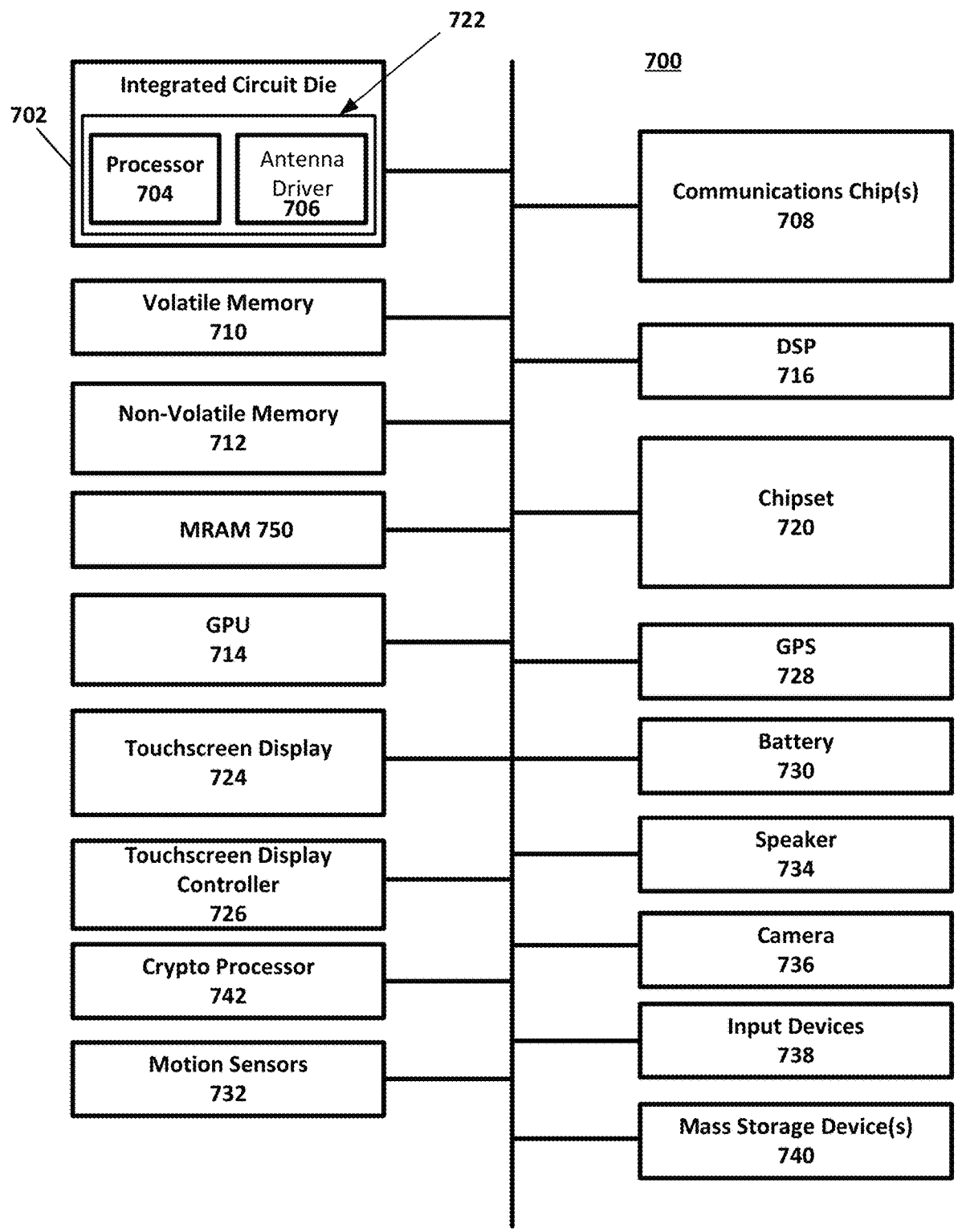
FIG. 7 illustrates a computing device in accordance with one embodiment of the disclosure.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single SoC die. The components in the computing device 700 include, but are not limited to, an integrated circuit die 702 and at least one communications logic unit 708. In some implementations, the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a CPU 704, as well as an antenna driver 706, that can be provided by technologies such as embedded DRAM (eDRAM) or spin-transfer torque memory (SUM or STT-MRAM).

The integrated circuit die 702 can include an on-chip loop antenna 722 in the metallization stack (e.g., at the M7 layer). The on-chip loop antenna 722 can surround the CPU 704 and the antenna driver 706. In some embodiments, other computing device circuit elements can reside on the integrated circuit die 702, such as the communications chip 708. In such scenarios, the on-chip loop antenna 722 can also surround these other circuit elements (including the communications chip 708).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disc (CD), digital versatile disk (DVD), and so forth).

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi and Bluetooth and a second communications logic unit 708 may be dedicated to longer range wireless communications such as GPS, EDGE, GPRS, CDMA, WiMAX, LTE, Ev-DO, and others.

In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
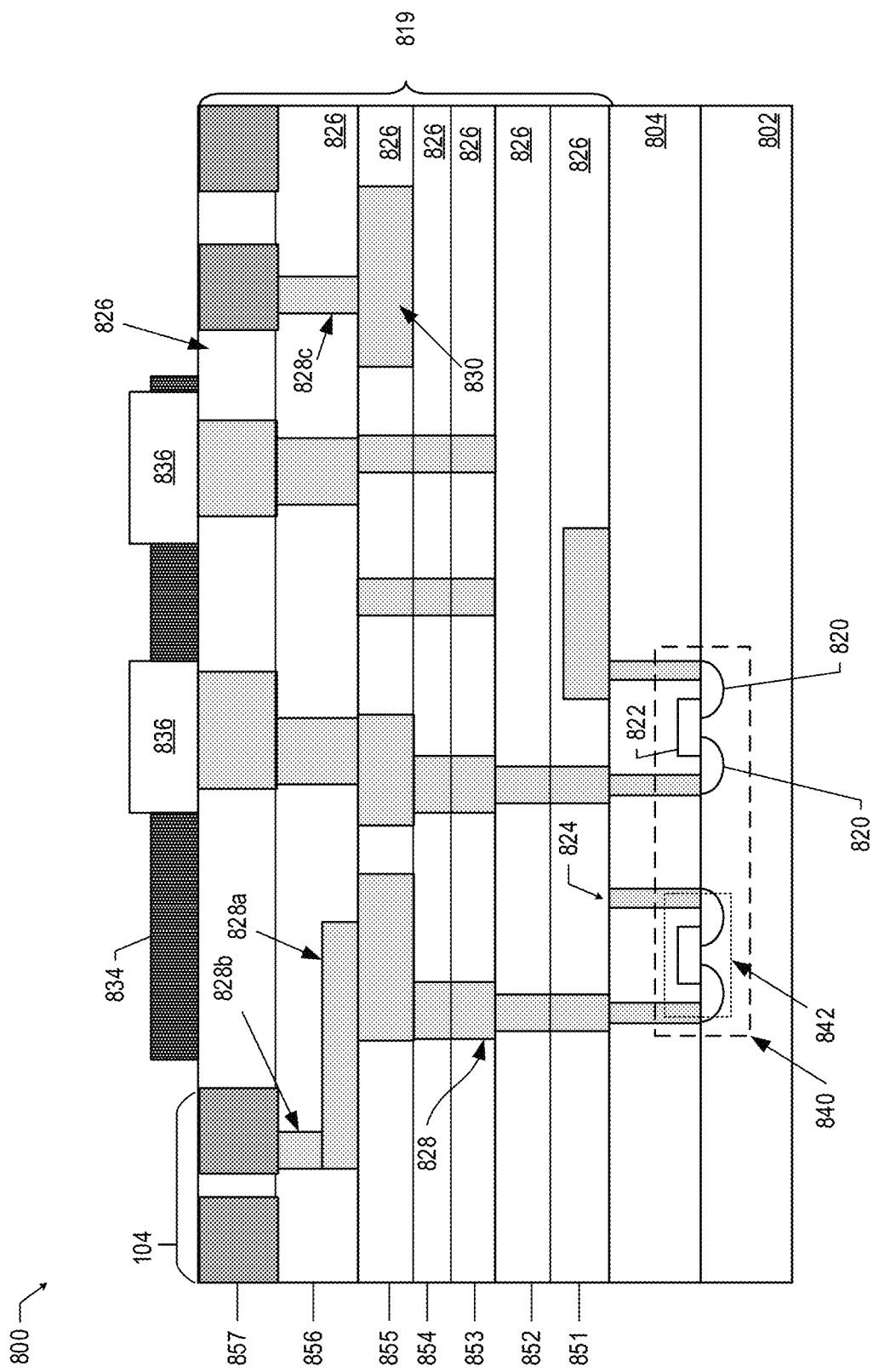
FIG. 8 is a cross-sectional side view of an integrated circuit (IC) device that may include an on-chip loop antenna surrounding an integrated circuit in accordance with any of the embodiments disclosed herein.

FIG. 8 is a cross-sectional side view of an IC device 800 that may include an on-chip loop antenna surrounding an integrated circuit in accordance with any of the embodiments disclosed herein. One or more of the IC devices 800 may be included in one or more dies. The IC device 800 may be formed on a substrate 802 and may be included in a die. The substrate 802 may be a semiconductor substrate composed of semiconductor material systems including, for example, n-type or p-type materials systems (or a combination of both). The substrate 802 may include, for example, a crystalline substrate formed using a bulk silicon or a silicon-on-insulator (SOI) substructure. In some embodiments, the substrate 802 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 802. Although a few examples of materials from which the substrate 802 may be formed are described here, any material that may serve as a foundation for an IC device 800 may be used.

The IC device 800 may include one or more device layers 804 disposed on the substrate 802. The device layer 804 may include features of an integrated circuit 840 (e.g., core circuitry that includes an antenna driver) formed on the substrate 802. The device layer 804 may include, for example, one or more transistors 842 that make up the integrated circuit 840. The transistors 842 can include one or more source and/or drain (S/D) regions 820, a gate 822 to control current flow between the S/D regions 820, and one or more S/D contacts 824 to route electrical signals to/from the S/D regions 820. The integrated circuit 840 can include one or more transistors 842 may include additional features not depicted for the sake of clarity, such as device isolation regions, gate contacts, and the like. The transistors 842 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 842 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 842 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 842 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the substrate 802 adjacent to the gate 822 of each transistor 842. The S/D regions 820 may be formed using an implantation/diffusion process or an etching/deposition process, for example. In the former process, dopants such as boron, aluminum, antimony, phosphorous, or arsenic may be ion-implanted into the substrate 802 to form the S/D regions 820. An annealing process that activates the dopants and causes them to diffuse farther into the substrate 802 may follow the ion-implantation process. In the latter process, the substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

In some embodiments, the device layer 804 may include one or more integrated circuits, in addition to or instead of transistors 842.

Electrical signals, such as power and/or input/output (I/O) signals, may be routed to and/or from the devices (e.g., transistors 842 and/or integrated circuit 840) of the device layer 804 through one or more interconnect layers disposed on the device layer 804 (illustrated in FIG. 8 as interconnect layers 851-857). For example, electrically conductive features of the device layer 804 (e.g., the gate 822 and the S/D contacts 824) may be electrically coupled with the interconnect structures 828 of the interconnect layers 851-857. The one or more interconnect layers 851-857 may form a metallization stack (also referred to as an "ILD stack") 819 of the IC device 800. In some embodiments, one or more loop antennas 104 may be disposed in one or more of the interconnect layers 851-857, in accordance with any of the techniques disclosed herein.

The interconnect structures 828 may be arranged within the interconnect layers 851-857 to route electrical signals according to a wide variety of designs (in particular, the arrangement is not limited to the particular configuration of interconnect structures 828 depicted in FIG. 8). Although a particular number of interconnect layers 851-857 is depicted in FIG. 8, embodiments of the present disclosure include IC devices having more or fewer interconnect layers than depicted.

In some embodiments, the interconnect structures 828 may include lines 828*a* and/or vias 828*b* filled with an electrically conductive material such as a metal. The lines 828*a* may be arranged to route electrical signals in a direction of a plane that is substantially parallel with a surface of the substrate 802 upon which the device layer 804 is formed. For example, the lines 828*a* may route electrical signals in a direction in and out of the page from the perspective of FIG. 8. The vias 828*b* may be arranged to route electrical signals in a direction of a plane that is substantially perpendicular to the surface of the substrate 802 upon which the device layer 804 is formed. In some embodiments, the vias 828*b* may electrically couple lines 828*a* of different interconnect layers 851-857 together. In embodiments, line 828a can route antenna driver signals from an antenna driver circuit in the device layer 804 to a via 828b, which connects the antenna driver in the device layer 804 to the on-chip loop antenna 104.

The metallization stack 819 may include a dielectric material 826 disposed between the interconnect structures 828, as shown in FIG. 8. In some embodiments, the dielectric material 826 disposed between the interconnect structures 828 in different ones of the interconnect layers 851-857 may have different compositions; in other embodiments, the composition of the dielectric material 826 between different interconnect layers 851-857 may be the same.

A first interconnect layer 851 (referred to as Metal 1 or "M1") may be formed directly on the device layer 804. In some embodiments, the first interconnect layer 806 may include lines 828a and/or vias 828b, as shown. The lines 828a of the first interconnect layer 806 may be coupled with contacts (e.g., the S/D contacts 824) of the device layer 804.

A second interconnect layer 852 (referred to as Metal 2 or "M2") may be formed directly on the first interconnect layer 806.

A third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the IC device 800 (i.e., farther away from the device layer 804) may be thicker.

FIG. 8 illustrates seven interconnect layers (e.g., M1 851 through M7 857). In the embodiment illustrated in FIG. 8, the sixth interconnect layer M6 856 may include vias 828b to couple the lines 828a with the device layer 804 (though lines and vias in other "lower" interconnect layers). Although the lines 828a and the vias 828b are structurally delineated with a line within each interconnect layer (e.g., within the second interconnect layer 808) for the sake of clarity, the lines 828a and the vias 828b may be structurally and/or materially contiguous (e.g., simultaneously filled during a dual-damascene process) in some embodiments. In other embodiments, the device layer 804 can electrically couple the on-chip loop antenna 104 to the integrated circuit 840 using lines and interconnects in any combination of interconnect layers. The on-chip loop antenna 104 (showing two loops) is located in the seventh interconnect layer (M7 857). The on-chip loop antenna 104 can be coupled to a ground plane 830 in the fifth interconnect layer M5 855 by a via 828c in the sixth interconnect layer M6 856. The location of the ground plane 830 is shown in the M6 856 interconnect layer by example only, and it is understood that the ground plane 830 can reside in other layer, multiple layers, and/or in other parts of the IC device.

The IC device 800 may include a solder resist material 834 (e.g., polyimide or similar material) and one or more conductive contacts 836 formed on the interconnect layers 851-857. In FIG. 8, the conductive contacts 836 are illustrated as taking the form of bond pads. The conductive contacts 836 may be electrically coupled with the interconnect structures 828 and configured to route the electrical signals of the transistor(s) 842 to other external devices. For example, solder bonds may be formed on the one or more conductive contacts 836 to mechanically and/or electrically couple a chip including the IC device 800 with another component (e.g., a circuit board). The IC device 800 may include additional or alternate structures to route the electrical signals from the interconnect layers 851-857; for example, the conductive contacts 836 may include other analogous features (e.g., posts) that route the electrical signals to external components.

It is understood that the subject matter of the present description is not necessarily limited to specific applications illustrated in FIGS. 1-8. The subject matter may be applied to other microelectronic device and assembly applications, as well as any appropriate heat removal application, as will be understood to those skilled in the art.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The relative sizes of features shown in the figures are not drawn to scale.

The following paragraphs provide examples of various ones of the embodiments disclosed herein.

Example 1 is an integrated circuit chip that includes an antenna driver circuit; a loop antenna surrounding the antenna driver circuit; and an interconnect electrically connecting the antenna driver circuit to the loop antenna.

Example 2 may include the subject matter of example 1, and may also include a processor core circuit, wherein the loop antenna surrounds the processor core circuit.

Example 3 may include the subject matter of any of examples 1-2, and may also include an inductor, wherein the loop antenna surrounds the inductor.

Example 4 may include the subject matter of any of examples 1-3, wherein the loop antenna includes a plurality of loops surrounding the antenna driver circuit.

Example 5 may include the subject matter of any of examples 1-4, and may also include a ground plane, the ground plane electrically coupled to the antenna driver circuit and the loop antenna by one or more metal vias.

Example 6 may include the subject matter of any of examples 1-5, wherein the loop antenna includes copper.

Example 7 may include the subject matter of any of examples 1-6, wherein the loop antenna includes a metal occupying one or more metal layers.

Example 8 may include the subject matter of example 7, wherein the loop antenna includes at least one loop in the M7 metal layer.

Example 9 may include the subject matter of any of examples 1-8, wherein the antenna driver is to differentially drive the loop antenna.

Example 10 may include the subject matter of any of examples 1-9, wherein the loop antenna includes an impedance substantially similar to an impedance of the antenna driver.

Example 11 is a semiconductor package that includes a printed circuit board and an integrated circuit chip. The integrated circuit chip includes a semiconductor substrate; an integrated circuit; and a loop antenna surrounding the integrated circuit. The semiconductor package also includes a metal shield enclosing the integrated circuit chip.

Example 12 may include the subject matter of example 11, wherein the integrated circuit chip includes a flip chip interface coupled to the printed circuit board.

Example 13 may include the subject matter of any of examples 11-12, wherein the loop antenna resides at a metal 7 layer of the semiconductor substrate and resides proximate to the printed circuit board.

Example 14 may include the subject matter of any of examples 11-13, wherein the metal shield is to prevent electromagnetic radiation from emanating from the shield.

Example 15 may include the subject matter of any of examples 11-14, wherein the loop antenna is to radiate electromagnetic energy through the printed circuit board.

Example 16 may include the subject matter of any of examples 11-15, wherein the integrated circuit includes an antenna driver circuit.

Example 17 may include the subject matter of example 16, wherein the antenna driver circuit is to drive the antenna differentially.

Example 18 may include the subject matter of any of examples 11-17, wherein the semiconductor substrate includes a ground plane electrically coupled to the integrated circuit and to the loop antenna.

Example 19 may include the subject matter of any of examples 11-18, wherein the semiconductor substrate further includes an inductor.

Example 20 may include the subject matter of any of examples 11-19, wherein the integrated circuit chip is a first integrated circuit chip that includes a first semiconductor substrate, a first loop antenna, and a first integrated circuit. The semiconductor package further includes a second integrated circuit chip that includes a second semiconductor substrate; a second integrated circuit; and a second loop antenna surrounding the second integrated circuit.

Example 21 may include the subject matter of example 20, further including a common ground plane electrically coupled to the first loop antenna and the second loop antenna.

Example 22 is a method of manufacturing a loop antenna integrated into a silicon substrate, the method including estimating, for a predetermined integrated circuit, an output impedance value; determining, based on the estimated output impedance value; one or more physical characteristics of the loop antenna; forming, by a semiconductor manufacturing process, the integrated circuit; and forming, by a semiconductor process, the loop antenna within the same semiconductor substrate as the integrated circuit.

Example 23 may include the subject matter of example 22, wherein the loop antenna is formed as part of a metal layer.

Example 24 may include the subject matter of example 23, wherein the metal layer includes the M7 metal layer.

Example 25 may include the subject matter of any of examples 22-24, wherein determining one or more physical characteristics includes determining a thickness, width, composition, or number of loops for the loop antenna based on the estimated output impedance of the integrated circuit.

What is claimed is:

1. An integrated circuit (IC) die, comprising:
   metal loops substantially centered around a core region of the IC die;
   a dielectric between spaces of the metal loops;
   an electric circuit in the core region electrically coupled to the metal loops with an interconnect; and
   a ground plane in a metallization stack of the IC die, wherein:
   the metal loops are in the metallization stack,
   the ground plane is electrically coupled to the metal loops with a first plurality of vias,
   the ground plane is electrically coupled to the electric circuit with a second plurality of vias,
   the electric circuit includes an inductor,
   the metal loops constitute a loop antenna,
   exciting the metal loops in a first direction causes electric currents in the metal loops to cancel each other, and
   exciting the metal loops in a second direction perpendicular to the first direction causes electric currents in the metal loops to aggregate.

2. The IC die of claim 1, wherein the metal loops are electrically coupled together in series.

3. The IC die of claim 1, wherein:
   a portion of the electric circuit comprises a driver circuit configured to electromagnetically excite the metal loops,
   the driver circuit has a first impedance,
   the metal loops have a second impedance, and
   the second impedance is substantially equal to the first impedance.

4. The IC die of claim 1, wherein:
   the interconnect has a first impedance,
   the metal loops have a second impedance, and
   the second impedance is substantially equal to the first impedance.

5. The IC die of claim 1, wherein:
   the metallization stack comprises layers of metal arranged along a thickness of the die, each layer separated from adjacent layers by the dielectric,
   one of the metal loops is in a first layer of the metallization stack, and
   another of the metal loops is in a second layer of the metallization stack different from the first layer.

6. The IC of claim 1, wherein
   the IC die comprises a plurality of loop antennas separated laterally from each other, and
   each loop antenna surrounds a respective electric circuit.

7. The IC die of claim 6, wherein the plurality of loop antennas laterally separated from each other are arranged in an array.

8. The IC die of claim 1, wherein the metal loops comprise copper.

9. The IC die of claim 1, wherein:
   the metal loops are in a first plurality of layers of the metallization stack, and
   the electric circuit is in a second plurality of layers of the metallization stack.

10. A semiconductor package, comprising:
    a printed circuit board (PCB);
    an IC die comprising:
    a semiconductor substrate;
    a metallization stack comprising layers of conductive metal traces stacked along a thickness of the IC die, separated from each other by a dielectric material, and electrically coupled with conductive vias in the dielectric material;
    a ground plane in one of the layers of the metallization stack;
    an IC including an inductor, a portion of the IC in the semiconductor substrate and another portion of the IC in the metallization stack, the IC being electrically coupled to the ground plane with one plurality of vias;
    a loop antenna surrounding the IC in another one of the layers of the metallization stack and electrically coupled to the ground plane with another plurality of vias; and
    a metal shield enclosing the IC die,
    wherein the loop antenna includes metal loops configured to cause electric currents in the metal loops to cancel each other when excited in a first direction, and to aggregate when excited in a second direction perpendicular to the first direction.

11. The semiconductor package of claim 10, wherein the IC die is coupled to the PCB with flip-chip interconnects.

12. The semiconductor package of claim 10, wherein the metal shield comprises nickel-silver.

13. The semiconductor package of claim 10, wherein the IC die and the metal shield are on one side of the PCB, and electromagnetic energy from the IC die radiates outwards through other sides of the PCB.

14. The semiconductor package of claim 10, wherein the loop antenna comprises metal loops in a plurality of layers of the metallization stack, each metal loop stimulated by a respective antenna driver circuit in the IC.

15. The semiconductor package of claim 14, wherein the metal loops are electrically coupled in series.

16. The semiconductor package of claim 10, wherein:
the IC die further comprises a plurality of loop antennas,
each loop antenna is laterally separated from others in the plurality of loop antennas,
each loop antenna encloses a respective IC,
the ground plane is common to the plurality of loop antennas, and
the ground plane is in a space between the loop antennas.

17. The semiconductor package of claim 10, wherein:
the IC die further comprises a plurality of loop antennas,
each loop antenna is laterally separated from others in the plurality of loop antennas, and
each loop antenna encloses a respective IC and a respective portion of the ground plane.

18. A computing device, comprising:
a memory;
a communications chip; and
an IC die that includes an antenna driver circuit having an inductor, wherein:
a loop antenna surrounds the antenna driver circuit,
an interconnect electrically couples the antenna driver circuit to the loop antenna,
a first plurality of vias through a metallization stack in the IC die electrically couples a ground plane with the antenna driver circuit,
a second plurality of vias through the metallization stack in the IC electrically couples the ground plane with the loop antenna,
the loop antenna includes metal loops configured to cause electric currents in the metal loops to cancel each other when excited in a first direction, and to aggregate when excited in a second direction perpendicular to the first direction.

19. The computing device of claim 18, wherein the loop antenna comprises a plurality of metal loops in different layers of the metallization stack.

20. The computing device of claim 18, wherein the loop antenna comprises a plurality of metal loops in a layer of the metallization stack.

* * * * *

UNITED STATES PATENT AND TRADEMARK OFFICE
CERTIFICATE OF CORRECTION

| | | |
|---|---|---|
| PATENT NO. | : 11,955,728 B2 | Page 1 of 1 |
| APPLICATION NO. | : 17/381073 | |
| DATED | : April 9, 2024 | |
| INVENTOR(S) | : Nir Weisman et al. | |

It is certified that error appears in the above-identified patent and that said Letters Patent is hereby corrected as shown below:

In the Claims

In Column 12, Claim 6, Line 30, delete "IC of" and insert -- IC die of --, therefor.

Signed and Sealed this
Fourteenth Day of May, 2024

Katherine Kelly Vidal
*Director of the United States Patent and Trademark Office*